United States Patent [19]

Trapani

[11] 4,410,209

[45] Oct. 18, 1983

[54] WAFER-HANDLING TOOL

[76] Inventor: Silvio P. Trapani, 1907 Cordilleras Rd., Redwood City, Calif. 94062

[21] Appl. No.: 357,056

[22] Filed: Mar. 11, 1982

[51] Int. Cl.³ ............................................. B05C 13/02
[52] U.S. Cl. ..................................... 294/34; 294/31.2
[58] Field of Search .................... 294/34, 31.2, 15, 16, 294/1 R, 31 R, 33, 74, 99 R; 81/355, 362, 356; 100/266

[56] References Cited

U.S. PATENT DOCUMENTS

| 754,250 | 3/1904 | Solomon . | |
|---|---|---|---|
| 910,190 | 1/1909 | Gossett . | |
| 987,238 | 3/1911 | Kersten | 294/34 |
| 2,678,000 | 5/1954 | Scheidt et al. | 100/266 |
| 3,482,476 | 12/1969 | Tonksley | 294/34 |
| 3,496,807 | 2/1970 | Jones et al. | 81/43 |
| 3,741,602 | 6/1973 | Ploeckelmann | 294/99 R |
| 3,918,756 | 11/1975 | Saville | 294/31.2 |

FOREIGN PATENT DOCUMENTS 991794 10/1951 France ........................................ 5/4

*Primary Examiner*—James B. Marbert
*Attorney, Agent, or Firm*—Warren F. B. Lindsley

[57] ABSTRACT

A special tool designed for picking up and holding circular silicon wafers, the tool incorporating a spring-biased plunger. As the plunger is withdrawn by the spring, a grooved tip at the end of the extended plunger engages one edge of the wafer, driving the opposite edge of the wafer into an arcuate groove on an opposing surface of the body of the tool.

9 Claims, 7 Drawing Figures

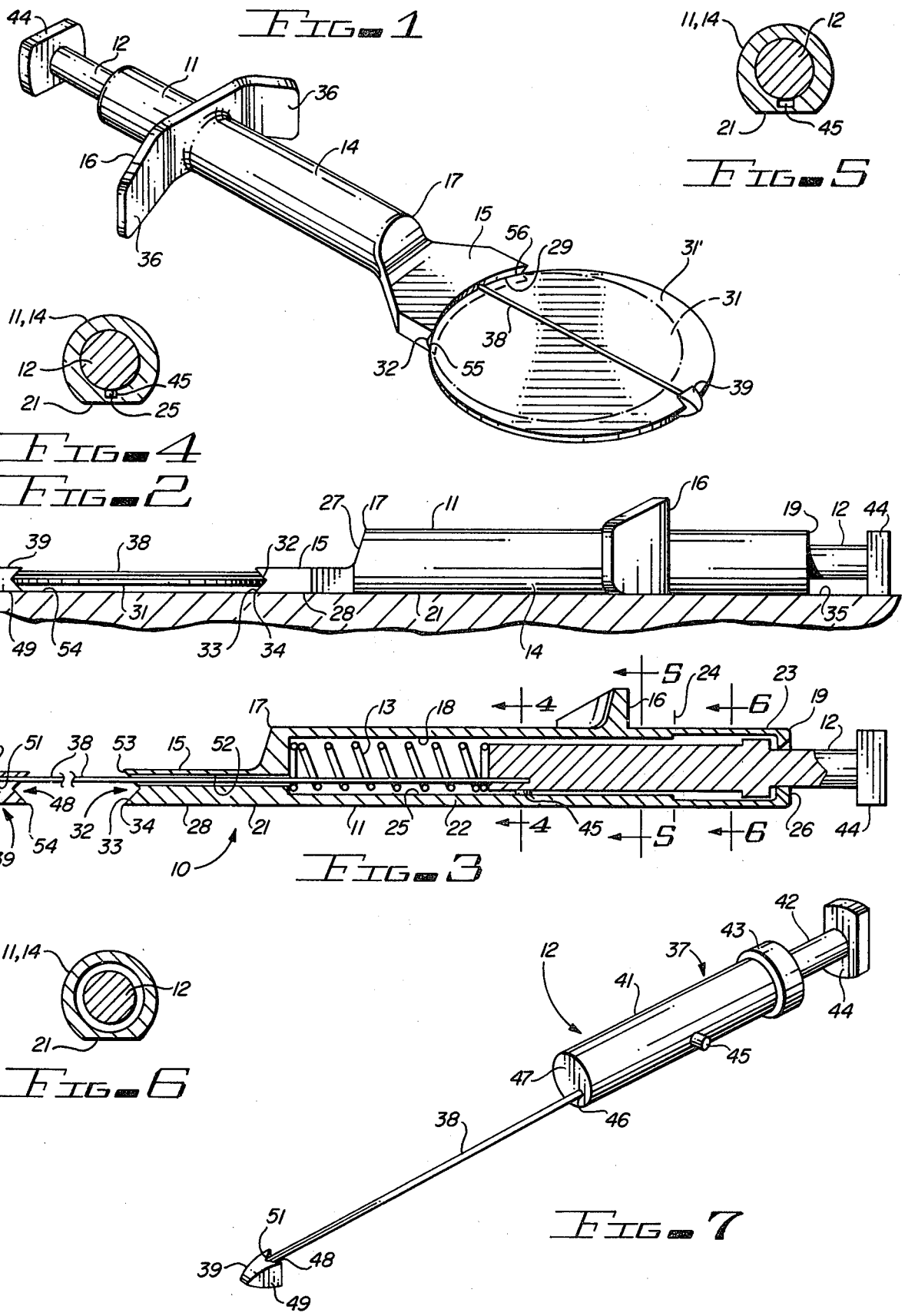

WAFER-HANDLING TOOL

BACKGROUND OF THE INVENTION

At one stage in the manufacturing of semiconductors and integrated circuits, a large array of the individual devices is formed on the surface of a thin circular wafer. Individual wafers typically range from two to four inches in diameter and are quite thin and fragile, requiring great care to prevent damage during handling.

During the fabrication process, these wafers are transferred from station to station in a container called a U-boat which accommodates approximately twenty-five wafers. These wafers are supported vertically in slotted edges of the U-boat and are spaced about one-fourth of an inch apart.

At one point in the process, the wafers are transferred from the U-boat to a heat-resistant quartz crystal container known as an elephant boat in which they are again supported vertically. The elephant boat with its charge of wafers is placed in a furnace at approximately 1200 degrees Centigrade for varying periods of time during the diffusion process. Following completion of the diffusion process, the wafers are returned to the U-boats for further processing including a chemical wash utilizing acids and solvents such as hydrochloric, nitric, phosphoric and hydrofloric acids, acetone, zylene, etc.

The high temperatures and the various chemical treatments render the wafers more and more fragile with each process and increasingly susceptible to contamination and corrosion in the event of exposure to body oils and acids during handling.

A common method of handling the wafers to avoid contamination and other damage is to use a specially designed tweezer with flat tips. The top and bottom surfaces of the wafer near their edges are gripped between these flat tips. This method is not altogether satisfactory because the surface area that is gripped by the flat tips may be damaged and, furthermore, not securely or stably held by the tweezer during handling. Damage and losses due to these causes reduce yield and drive up total processing costs.

An improved tool is thus needed for handling the wafers which makes it unnecessary to exert any force on the face of the wafer. This tool should firmly grip the wafer and limit the forces applied thereto to values that will not result in fracture.

DESCRIPTION OF THE PRIOR ART

U.S. Pat. No. 3,741,602 discloses a tweezer for holding a fragile unit including two arm members having respective free ends movable upon the application of horizontal pressure from an open position of nonvertical alignment to a closed position of vertical alignment. The arm ends include gripping surfaces for engaging and securely holding the fragile unit at its periphery when the tweezer is in a closed position.

The French Pat. No. 991.794 discloses a device for lifting a pan by stationary fingers and employs a spring biased plunger.

U.S. Pat. No. 2,678,000 discloses a tea bag holder employing a pair of complemental relatively movable gripping jaws spring operated by a plunger slidable in a handle.

U.S. Pat. No. 754,250 discloses a plate lifter which grasps the edges of the articles for moving them from place to place.

U.S. Pat. No. 910,190 discloses a pan lifter employing engaging means for grasping one edge of a pan and a movable engaging member for grasping the edge of the pan at a point opposite the first means. A resilient member imparts pressure to the pan to maintain the engaging means in engagement therewith.

U.S. Pat. No. 3,496,807 discloses a tweezer for picking up silicon wafers which grips one edge of the article.

None of these references disclose a structure for picking up and securely holding in a protective manner, among other things, a wafer from a flat surface.

SUMMARY OF THE INVENTION

In accordance with the invention claimed, an improved tool is provided for handling individual silicon wafers. The tool grips the edges of the wafer with a controlled amount of applied pressure, holds it securely and prevents it from being dropped. The tool provides convenience and dexterity during grasping of the wafer while maneuvering the wafer into a new position before releasing it.

It is, therefore, one object of this invention to provide an improved tool for handling individual silicon wafers during the processing of semiconductors.

Another object of this invention is to provide such a tool in a form that grips only the edges of the wafer, avoiding touching the face of the wafer in the location of the semiconductor chips.

A further object of this invention is to provide such a tool wherein the pressure applied to the wafer is determined by the physical characteristics of the tool rather than by manual pressure applied by the fingers of the user.

A still further object of this invention is to provide such a tool in a form that will permit the wafer to be held in a stable and secure manner so that it may be handled with little risk of dropping.

A still further object of this invention is to provide such a tool that permits the wafer to be picked up quickly from its vertically oriented position in the U-boat or elephant boat and quickly released in a new position.

A still further object of this invention is to provide a new and improved tool that can pick up a wafer lying on a flat surface.

A still further object of this invention is to provide a new and improved tool that may be comfortably held in a working position by a human hand permitting dexterity of use.

A still further object of this invention is to provide such a tool in a form that can be inexpensively manufactured from materials that are inherently nonabrasive and reasonably flexible, yet strong enough to endure wear and operating stresses.

Yet another object of this invention is to increase production yields of silicon wafers by reducing damage during handling through the use of the disclosed new and improved tool.

Further objects and advantages of the invention will become apparent as the following description proceeds, and the features of novelty which characterize the invention will be pointed out with particularity in the claims annexed to and forming a part of this specification.

BRIEF DESCRIPTION OF THE DRAWING

The present invention may be more readily described with reference to the accompanying drawing, in which:

FIG. 1 is a perspective top view of the improved wafer-handling tool of the invention, the tool being shown holding a silicon wafer;

FIG. 2 is a perspective side view of the tool and wafer shown in FIG. 1;

FIG. 3 is a cross-sectional view of the tool of FIGS. 1 and 2 taken lengthwise from the side;

FIG. 4 is a cross-sectional view of the tool as seen along line 4—4 of FIG. 3;

FIG. 5 is a cross-sectional view of the tool as seen along line 5—5 of FIG. 3;

FIG. 6 is a cross-sectional view of the tool as seen along line 6—6 of FIG. 3; and FIG. 7 is a perspective view of the plunger which is a part of the tool shown in FIGS. 1-6.

DESCRIPTION OF THE PREFERRED EMBODIMENT

Referring more particularly to the drawing by characters of reference, FIGS. 1–7 disclose an improved tool 10 intended for use in handling silicon wafers and similar objects and comprising a body 11, plunger 12 and a compression coil spring 13. Body 11 has a hollow cylindrical trunk 14, a flat front scoop 15 and a fin-shaped finger-grip 16.

Trunk 14 is approximately two and one-half inches long and has an outside diameter of approximately one-half of an inch and is closed at its front end 17, but its concentric cylindrical interior 18 is open at its rear 19. The underside 21 of trunk 14 is flattened as shown in the cross-sectional views of FIGS. 4-6.

The cylindrical interior 18 is divided into a forward portion 22 and a rear portion 23, the line of demarcation 24 between the forward and rear portions being located approximately five-eighths of an inch inwardly from rear 19. The rear portion 23 has a somewhat larger diameter than the forward portion 22 forming a ledge therebetween. The forward portion 22 has a longitudinal slot 25 extending along its full length lying along the bottom of the interior opening 18 of trunk 14 and is cut into the flattened underside 21 of the wall of trunk 14 inside of body 11. A snap lock retainer 26 in the shape of an inwardly extending tapered projection of the trunk wall is formed at the open end of interior 18 at rear 19 of body 11.

The front scoop 15 is flat and fan-shaped and extends outwardly from end 17 approximately one inch. At its forward end, scoop 15 is approximately one inch wide and continues rearwardly towards trunk 14 approximately one-half of an inch. From there, the scoop narrows linearly to the width of trunk 14 at the point of attachment of scoop 15 to trunk 14.

Scoop 15 is attached to the lower outer edge of the forward face 27 of trunk 14 so that the flat underside 28 of scoop 15 is coplanar and continuous with the flat underside 21 of trunk 14 as shown in FIGS. 2 and 3. The forward edge 29 of scoop 15 is arcuate, presenting a concave edge with a radius of curvature that is slightly smaller than the radius of the smallest wafer 31 that tool 12 is intended to handle. A wedge-shaped groove 32 is cut into the arcuate forward edge 29 and extends the full length of the arcuate edge 29. The lower face 33 of groove 32 forms with the flat surface 28 a sharp leading edge 34. When tool 10 is placed on a table or other flat surface 35, as shown in FIG. 2, the sharp edge 33 rests on surface 35.

The fin-shaped finger-grip 16 is in the form of an arcuate strap or leaf spring and is attached laterally at its center to trunk 14 at a position just slightly rearward of the longitudinal center of trunk 14 with ends 36 curving forwardly.

The entire body 11, including trunk 14, scoop 15 and finger-grip 16 is formed or molded into a single piece from a tough material such as nylon, teflon, or any suitable plastic having similar physical characteristics.

Plunger 12, comprising a body 37, a shaft 38 and end-grip 39, has a cylindrical forward section 41 and a cylindrical rearward section 42. Section 41 is approximately twice as long and slightly larger in diameter than section 42. A disc-shaped radial projection 43 separates sections 41 and 42. A flat rectangular thumb-piece 44 caps the rearward end of section 42. A small cylindrical knob 45 extends radially outwardly from section 41 and is located slightly forwardly of the center of section 41.

Shaft 38 is preferably made of stainless steel coated with teflon which coating serves as a cushion to prevent shaft 38 from inflicting damage on the silicon wafer during any inadvertent contact therewith. Shaft 38 is longitudinally aligned with body 37 and is attached thereto by insertion and cementing into a hole 46 drilled into the forward surface 47 of body 37. Hole 46 enters surface 47 near one edge at the same side of body 41 at which knob 45 is located. As will be shown later, the side of the body at which knob 45 and hole 46 are located is the underside of body 37 when plunger 12 is installed in body 11 of tool 10 and placed on surface 35, as shown in FIG. 2.

The end-grip 39 of tool 10 has an overall rectangular shape, except that its rearward face has a wedge-shaped groove 48 arranged therein, and its front face may be tapered as shown in FIG. 7 for use, among other things, as a pointer for moving wafers around when they are lying on a flat surface. Groove 48 is identical in form and dimension to groove 32 of scoop 15, having apexes lying in a common plane spaced from the flat surfaces of scoop 15 and cylinder 11. The undersurface 49 of end-grip 39 is flat with shaft 38 attached thereto by being inserted and cemented into a hole 51 that is drilled into the upper face of groove 48. Hole 51 lies parallel with the undersurface 49 of end-grip 39. As shown more clearly in FIG. 7, end-grip 39, when attached to body 37 by means of shaft 38, is oriented relative to body 37 such that the flat undersurface 49 is coplanar with the flat underside 28 of scoop 15 and with the flat underside 21 of body 11.

End-grip 39 and body 37 both may be molded or fabricated from the same material employed for molding or fabricating body 11.

Spring 13 has an outer diameter that is slightly smaller than the diameter of forward portion 22 of interior 18 of body 11. The compression force of spring 13 is carefully chosen to prevent excessive stress on wafer 31 during the use of tool 10.

The assembly of tool 10 is accomplished as follows: Shaft 38 is first mounted and secured in hole 46 of plunger 12 and spring 13 is placed inside body 11 at the forward end of its hollow interior 18, as shown in FIG. 3. Shaft 38 of plunger 12 is then passed into interior 18 of body 11 through its end 19 and is then inserted in and passed through a clearance hole 52 arranged to extend axially through scoop 15 and exits through the upper face 53 of groove 32. Hole 52 is parallel to the underside 28 of scoop 15. As shaft 38 is passed through hole 52, body 37 of plunger 12 enters the interior 18 of body 11.

During the insertion of shaft 38 and body 41 into body 11, it is necessary to insure that knob 45 is aligned with slot 25 of forward portion 22. This will also permit alignment of shaft 38 with hole 52. Shortly after knob 45 engages and enters slot 25, projection 43 will engage the snap-lock retainer 26. At this time, an increased insertion force is required to force projection 43 past retainer 26. Once this has been accomplished, projection 43 will have been captured within the enlarged rear portion 23 of interior 18 of body 11. With projection 43 thus captured, plunger 12 may be moved forward within interior 18 against the force of spring 13 until projection 43 impinges the shoulder formed by the rearward extremity of forward portion 22 at line 24. When the external force on plunger 12 is released, spring 13 drives plunger 12 rearward until projection 43 impinges retainer 26.

It will be noted that during insertion of plunger 12 into body 11, projection 43 confronts a tapered edge of retainer 26 which permits retainer 26 to yield under pressure so that projection 43 may enter. When projection 43 is driven rearward by spring 13, it confronts a flat surface of retainer 26 that is perpendicular to its direction of travel forming an impassable barrier.

After shaft 38 and body 37 have been installed as just described, end-grip 39 is attached to the end of shaft 38 in the orientation shown by the drawing.

It will be noted from an examination of FIGS. 2 and 3 that grooves 32 and 48 of end-grip 39 and scoop 15, respectively, open towards each other. The sharp leading edge 34 of scoop 15 faces a similar sharp edge 54 formed by the lower face of groove 48 with the flat undersurface 49 of end-grip 39. This arrangement permits the use of tool 10 to pick up a circular wafer 31 from a flat surface 35 using the following procedure:

Tool 10 is held in one hand with the index finger engaging the forward surface of one end of finger-grip 16. The second finger engages the other end of finger-grip 16 with the thumb engaging the thumb-piece 44 of plunger 12. Thumb pressure is applied to force plunger 12 forward to the point at which projection 43 blocks further travel at line 24. Tool 10 is then lowered to surface 35 and positioned so that wafer 31 lies between edges 34 and 53 of scoop 15 and end-grip 39, respectively. Thumb pressure is then relaxed so that shaft 38 is withdrawn into body 11 under spring pressure. As shaft 38 is thus withdrawn, the sharp edges 34 and 54 of scoop 15 and end-grip 39 come into contact with the periphery of wafer 31, slipping under the peripheral edges of wafer 31 and scooping it up into grooves 32 and 48 of scoop 15 and end-grip 39.

As mentioned earlier, the radius of curvature of forward edge 29 of scoop 15 is somewhat smaller than the radius of the smallest wafer to be handled. Thus, whether a relatively small wafer 31 or a larger wafer 31′, as shown in FIG. 1, is gripped by tool 10, contact of scoop 10 with wafer 31 or 31′ is limited to the points 55 and 56 at the ends of groove 32. Three-point contact is thus effectively achieved, the third point of contact being provided by groove 43 of the very narrow end-grip 39. By virtue of this three-point contact, a stable grip of the wafer is achieved which prevents movement of the wafer relative to tool 10 during its handling.

Because the pressure exerted on the wafer by tool 10 is limited to that provided by spring 13, there is no opportunity for excess pressure to be applied by the person using the tool. A properly selected spring 13 thus prevents damage to the wafer due to any applied tool pressure, so that only a defective wafer may be broken by tool stresses.

In using tool 10 to collect wafers from a U-boat, a similar procedure is employed. In this case, the plunger is driven forward by the thumb of the user; tool 10 is positioned to align wafer 31 with grooves 32 and 43; and thumb pressure is released until the wafer is engaged. If during this procedure shaft 38 comes into contact with the surface of wafer 31, the teflon coating on shaft 38 cushions such contact and prevents damage to the wafer. The light weight of tool 10 also contributes toward preventing damage under these circumstances. It should be noted that when the wafer is firmly gripped in grooves 32 and 48 of the tool, its flat surface juxtapositioned to shaft 38 is spaced slightly therefrom. This is an important distinction over the prior art since it prevents the surface of the wafer from rubbing on the surface of shaft 38 and the resulting damages to the wafer.

An effective tool is thus provided for handling silicon wafers and similar fragile circular objects, in accordance with the stated objects of the invention.

Although but a single embodiment of the invention has been illustrated and described, it will be apparent to those skilled in the art that various changes and modifications may be made therein without departing from the spirit of the invention or from the scope of the appended claims.

What is claimed is:

1. A wafer-handling tool comprising:
    a hollow cylinder open at one end and forming a handle for said tool,
    said cylinder being flattened on its outer periphery along at least a part of its length,
    scoop means attached to the other end of said cylinder and forming a concave edge extending outwardly and laterally of said cylinder,
    said scoop means being provided with a flat surface arranged coplanar with said flat surface of said cylinder,
    a plunger movably mounted in the open end of said cylinder,
    spring means mounted in said cylinder for biasing said plunger toward said open end of said cylinder,
    a shaft attached at one end to said plunger to extend outwardly and longitudinally of the other end of said cylinder and the concave surface of said scoop means,
    a gripping means attached to the other end of said shaft,
    said gripping means being provided with a flat surface coplanar with the flat surface of said cylinder and said scoop means and presenting a concave edge facing the concave edge of said scoop means, and
    wedge-shaped grooves, one provided in each of the concave edges of said scoop means and said gripping means for holding a wafer therebetween,
    whereby movement of said plunger into said cylinder separates said gripping means from said scoop means and relaxation of the tension on said plunger and spring means causes movement of said gripping means toward said scoop means.

2. The wafer-handling tool set forth in claim 1 in further combination with:
    slot means formed in the inner periphery of said cylinder axially thereof, and knob means mounted on said plunger to extend laterally thereof for positioning in said slot means for guiding the movement of said plunger axially within said cylinder.

3. The wafer-handling tool set forth in claim 2 in further combination with:

stop means arranged within said cylinder for controlling the length of movement of said piston.

4. The wafer-handling tool set forth in claim 1 wherein:

said shaft is spaced from but parallel with the longitudinal axis of said cylinder.

5. The wafer-handling tool set forth in claim 1 in further combination with:

a fin-shaped finger-gripping means mounted on the outer periphery of said cylinder to extend laterally thereof.

6. The wafer-handling tool set forth in claim 1 wherein:

the length of said concave edge of said scoop means is greater than the length of the concave edge of said gripping means.

7. The wafer-handling tool set forth in claim 1 wherein:

one edge of each groove cut into the concave edges of said scoop means and said gripping means lies in the flat surface of said scoop means and said cylinder.

8. The wafer-handling tool set forth in claim 7 wherein:

the apexes of the grooves cut into the concave edges of said scoop means and said gripping means are spaced from their flat surfaces a like distance.

9. The wafer-handling tool set forth in claim 8 wherein:

the apexes of the grooves in the scoop means and gripping means lie in a plane spaced from the longitudinal axis of said shaft, whereby the juxtapositioned surface of a wafer held in these grooves by the tool is spaced from the surface of said shaft.

* * * * *